United States Patent [19]

Pelley, III

[11] Patent Number: 4,794,434

[45] Date of Patent: Dec. 27, 1988

[54] TRENCH CELL FOR A DRAM

[75] Inventor: Perry H. Pelley, III, Austin, Tex.

[73] Assignee: Motorola, Inc., Schaumburg, Ill.

[21] Appl. No.: 69,916

[22] Filed: Jul. 6, 1987

[51] Int. Cl.[4] .................. H01L 29/78; H01L 29/06; H01L 27/02

[52] U.S. Cl. .................................. 357/23.6; 357/55; 357/43

[58] Field of Search ........................... 357/23.6, 55, 43

[56] References Cited

U.S. PATENT DOCUMENTS 4,707,456 11/1987 Thomas et al. ...................... 357/43

FOREIGN PATENT DOCUMENTS

| 108390 | 5/1984 | European Pat. Off. | 357/23.6 |
| 97661 | 5/1985 | Japan | 357/43 |
| 152059 | 8/1985 | Japan | 357/23.6 |
| 154664 | 8/1985 | Japan | 357/23.6 |
| 90395 | 5/1986 | Japan | 357/23.6 |

Primary Examiner—Martin H. Edlow
Assistant Examiner—Robert P. Limanek
Attorney, Agent, or Firm—John A. Fisher; Jeffrey Van Myers; James L. Clingan, Jr.

[57] ABSTRACT

A DRAM memory cell has a trench capacitor and a transistor. The trench of the trench capacitor penetrates to a buried layer which acts as the primary portion of one of the plates of the capacitor. When the buried layer is the same conductivity type as the transistor of the memory cell, the buried layer is biased to a voltage selected to reduce the maximum voltage across the capacitor. This allows for a reduction in the thickness of the dielectric which coats the trench which increases the capacitance of the capacitor. When the buried layer is of the opposite conductivity type from the transistor type of the memory cell, there is no parasitic MOS transistor formed between the primary portion of the capacitor plate and the source of the transistor of the memory cell.

15 Claims, 4 Drawing Sheets

4,794,434

TRENCH CELL FOR A DRAM

FIELD OF THE INVENTION

The present invention relates to dynamic random access memory (DRAM) cells, and more particularly, to DRAM cells which are formed using a trench.

BACKGROUND OF THE INVENTION

A DRAM cell, formed of a transistor and a capacitor, is widely known. It has further become known to use a trench formed in the substrate as the capacitor of the DRAM cell. The advantage of a trench DRAM cell is an increase in area of the plates of the capacitor for a given surface area of the substrate. In constructing an array or subarray of DRAM cells, trench or otherwise, it is common for each of the capacitors in the array or subarray to have a common plate which is in common with the other cells in the array or subarray and have an individual plate which is connected to the transistor of the cell. In a trench DRAM cell, the individual plate can be either inside the trench or outside the trench. If it is outside the trench, there is a difficulty in keeping the individual plates of adjoining cells from diffusing together. If the individual plate is on the inside, there are also problems most of which are common to either approach.

Even with the increased plate area of a trench capacitor, it is still desirable to have more capacitance in the cell capacitor. One way to increase capacitance is to increase the doping level of the area outside the trench. This has the potential disadvantage of adversely affecting the transistors formed in the substrate. The transistors have better performance characteristics if the doping level is lower than that which is optimum for increasing the capacitance of the capacitor. An example in the prior art of addressing this problem is shown in FIG. 1 which shows a portion of a trench cell 10 formed in a substrate 11 which includes an epitaxial layer 12. This approach uses a P channel array formed in an N well 13 with P channel starting material. Epitaxial layer 12 is grown over substrate 11 which began as highly doped P+ silicon. The resulting epitaxial layer 12 of silicon is a lesser doped P silicon which is used for the formation of N channel transistors in the circuits which are peripheral to the array. N well 13 is then formed in a portion of epitaxial layer 12 doped to only N− for improved transistor performance. Well 13 is coupled to a positive voltage, such as 5 volts, which is shown as VDD in FIG. 1. Substrate 11 is coupled to a negative supply terminal such as ground shown in FIG. 1. Well 13 can be pumped to a voltage higher than the positive power supply VDD and, similarly, substrate 11 can be pumped to a more negative voltage as desired for circuit performance. A trench capacitor 14 is formed through N well 13 and epitaxial layer 12 and into substrate 11. Formed in well 13 is a source 16 and a drain 17. Source 16 and drain 17 are the source and drain of the transistor which, along with capacitor 14 form DRAM cell 10. Capacitor 14 is filled with P+ polysilicon 18 which is dielectrically separated from substrate 11, epitaxial layer 12, and well 13 by an oxide layer 19. Alternatively, layer 19 could be an oxide-nitride-oxide sandwich instead of just oxide. In either case, layer 19 forms a dielectric for capacitor 14. One plate of capacitor 14 is polysilicon 18 which is connected to source 16. This connection to source 16 is not shown in FIG. 1 but is generally accomplished with a conductive strap but can also be accomplished by etching down layer 19 prior to filling the trench with polysilicon 18 so that polysilicon 18 is in direct contact with source 16. The other plate is a combination of substrate 11, epitaxial layer 12, and well 13. Most of the contribution to the capacitance of capacitor 14 is from the substrate because it has a much higher doping concentration than epitaxial layer 12. Well 13 will provide very little contribution because it is lightly doped for transistor performance reasons.

Even though well 13 is lightly doped, there is a limit to how lightly it can be doped because of a parasitic MOS transistor formed between epitaxial layer 12 and source 16. Well 13 acts as the channel, polysilicon 18 acts as the gate, and layer 19 acts as the insulator between the gate and channel. Even a leakage current as low as 1 picoamp will remove the charge stored in capacitor 14 before it can be read and refresned. If well 13 is too lightly doped, the threshold voltage of this parasitic transistor is sufficiently low that it will be at least partially conductive and leak at the 1 picoamp rate which ensures loss of data. This lower concentration is desirable because the regular MOS transistors in well have their threshold adjusted by an implant. If the doping level in well 13 is high enough to ensure that the parasitic transistor will not leak off charge from capacitor 14, the threshold adjust implant will not be optimum. The threshold adjust implant is advantageous because, for a given threshold voltage, the body effect is less on a transistor which has had its threshold increased to that give threshold voltage by an implant than on a transistor whose threshold voltage is at the given threshold voltage by virtue of the doping concentration of the well or substrate in which it is formed. The optimum concentration of well 13 is sufficiently low that there would be leakage through the parasitic transistor of sufficient magnitude to destroy cell data, especially when doping variations due to manufacturing variations are taken into account. Process variations during the fabrication of the integrated circuit will result in even lower doping concentrations for some devices. This is handled by raising the target concentration which will thus raise the nominal doping concentration even further beyond the optimum concentration for well 13.

SUMMARY OF THE INVENTION

An object of the present invention is to provide an improved DRAM.

Another object of the present invention is to provide an improved DRAM memory cell.

Yet another object of the invention is to provide improved trench DRAM memory cell.

These and other objects are achieved in a semiconductor body including a substrate doped to a first concentration and a buried layer of a second concentration greater than said first concentration formed below a surface of said substrate. The semiconductor body has a memory cell comprises a transistor and a trench capacitor. The transistor has a gate and a conduction path. The trench capacitor is coupled to one side of the conduction path and is formed of a trench which penetrates the surface and into said buried layer.

DESCRIPTION OF THE INVENTION

Figure 1:
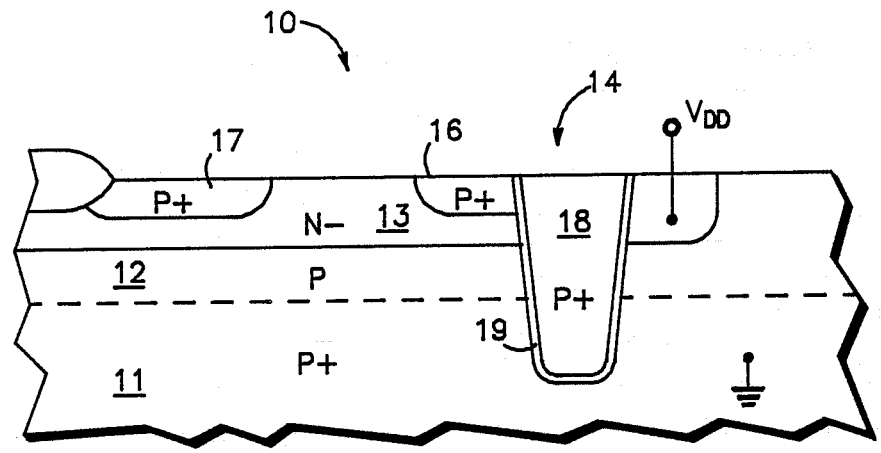
FIG. 1 is a cross-section of a portion of a trench DRAM cell device according to the prior art.
Figure 2:
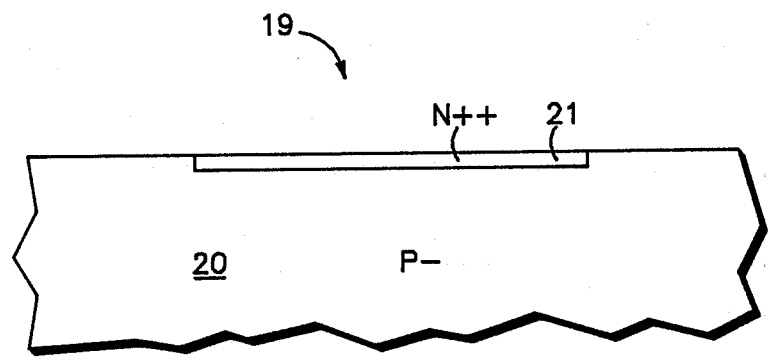
FIG. 2 is a cross-section of a substrate at an early stage in processing according to the prior art.
Figure 3:
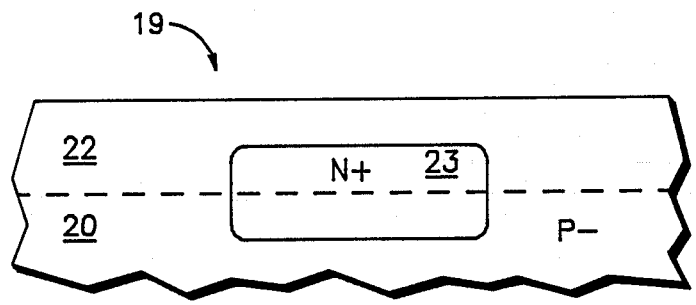
FIG. 3 is a cross-section of the substrate in FIG. 2 at a later stage in processing showing a buried layer according to the prior art.

As shown in FIG. 1, the use of an epitaxial layer for manufacturing a DRAM is in the prior art. Another feature available in prior art processing is a buried layer. The invention uses a buried layer as an important part of a trench DRAM cell. Shown in FIG. 2 is portion 19 of an integrated circuit having a P− substrate 20 and an N++ region 21 formed in the surface of substrate 20. Shown in FIG. 3 is substrate 20 after an epitaxial layer 22 has been grown. A dotted line is shown between substrate 20 and epitaxial layer 22. After processing the integrated circuit, doped portion 21 in FIG. 2 expands to an N+ buried layer 23 which is in both substrate 20 and epitaxial layer 22. Epitaxial layer 22 is P-type but can be any desired concentration for optimum circuit performance. A buried layer such as buried layer 23 is commonly found in integrated circuits which have bipolar transistors including integrated circuits which have both bipolar transistors and MOS transistors. The buried layer is for collectors of bipolar transistors. Such integrated circuits which have both bipolar and MOS transistors are often referred to as being "BiMOS." BiMOS appears to be increasing in popularity for integrated circuits, particularly memories, including Drams.

Figure 4:
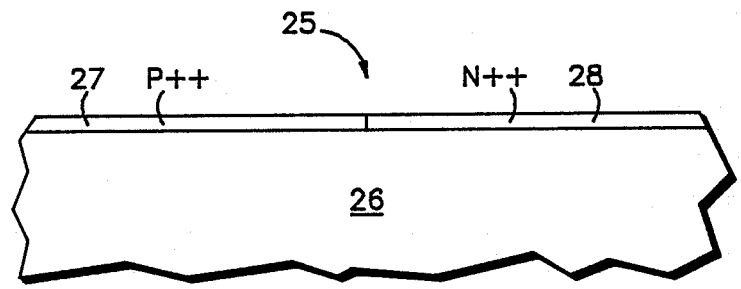
FIG. 4 is a cross-section of a substrate at an early stage in processing according to the prior art.
Figure 5:
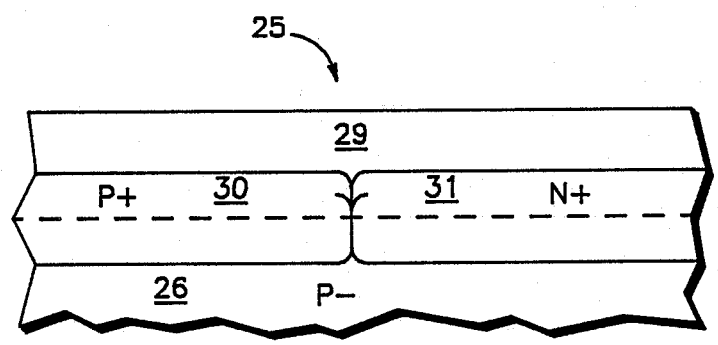
FIG. 5 is a cross-section of the substrate in FIG. 4 at a later stage in processing showing two buried layers according to the prior art.

Shown in FIG. 4 is a cross-section of a portion of an integrated circuit 25 having a substrate 16, a P++ region 28, and an N++ region 28 at a stage in a BiMOS process for forming a pair of adjoining buried layers. Shown in FIG. 5 is the portion of integrated circuit 25 of FIG. 4 after growing an epitaxial layer 29 and after other processing. This results in the formation of a P+ buried layer 30 and an N+ buried layer. Because regions 27 and 28 of FIG. 1 are adjoining, the resulting buried layers 30 and 31 are also adjoining. The location of regions 27 and 28 determine the location of buried layers 30 and 31. Thus a buried layer can be either of the same or the opposite conductivity type as the substrate. Buried layers are typically biased to some desired voltage. Buried layers of the same conductivity type as the substrate are, of course, biased to the same voltage as the substrate. Buried layers of the opposite conductivity of the substrate can be electrically isolated from the substrate if the PN junction between the buried layer and the substrate is not forward biased.

Figure 6:
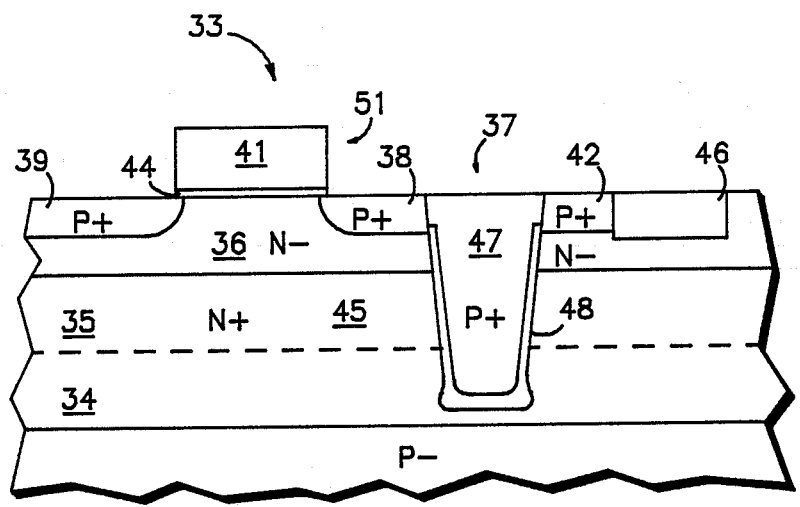
FIG. 6 is a cross-section of a DRAM well according to a first embodiment of the invention.

Shown in FIG. 6 is a cross-section of a memory cell 33 comprised of a substrate 34, an epitaxial layer 35, an N− well 36, a trench capacitor 37, a P+ source 38, a P+ drain 39, a gate 41, a P+ contact 42, an oxide isolation region 46, a gate insulator 44, and a N+ buried layer 45. Substrate 34 and epitaxial layer 35 are known as separated by a dotted line. Source 38, drain 39 and a portion of well 36 therebetween forms a conventional conduction path controlled by gate 41. This conduction path, which is on one side of capacitor 37, is connected to capacitor 37 via source 38. Buried layer 45 is in both the epitaxial layer 35 and substrate 34. Trench capacitor 37 is formed from a trench etched into the semiconductor body comprised of epitaxial layer 35 and substrate 34. Trench capacitor 37 is filled with a P+ polysilicon 47. Polysilicon 47 is dielectrically insulated from buried layer 45 and well 36 by an insulating layer shown as dielectric 48. A bottom portion of dielectric 48 is intentionally enlarged. This is achieved by an oxygen implant. The oxygen reacts with the silicon of substrate 34 to form an enlarged area of oxide. It has been found, in the prior art, that this bottom area of the trench is more vulnerable to punchthrough so that the increased thickness in this area is desirable. Polysilicon 47 is in contact with source 38 by virtue of dielectric 48 having been etched down. This etching down of the dielectric of the trench capacitor is known. A P channel transistor 51 is formed of source 38, drain 39, and gate 41. Transistor 51 and capacitor 37 form memory cell 33. Region 42 is formed during the formation of source 38 and is present for alignment tolerance. Polysilicon 47 is one plate on capacitor 37. Buried layer 55 has a portion adjacent to dielectric 48. Well 36 also has a portion adjacent to dielectric 48. These portions of well 36 and buried layer 45 which are adjacent to dielectric 48 form a second plate of capacitor 37. The primary contribution to the capacitance of capacitor 37 is from buried layer 45 which is of a high concentration of N-type dopant. Thus, except for the contribution from well 36, the capacitance of capacitor 37 is all from a high doping concentration. This advantage of increasing the capacitance with a high doping concentration does not cause a decline in performance of transistors because the buried layer, as its name suggests, does not reach the surface. By having N well 36 extend down to buried layer 445, there is no parasitic MOS transistor between source 38 and the region which contributes to the capacitance of capacitor 37. The portion of substrate 34 which is P− is separated from source 38 by buried layer 45. There is thus no danger of fomming even a marginally conductive MOS transistor between substrate 34 and source 38. Memory cell 33 thus offers an advantage over that shown in FIG. 1. Additionally, in the case in which the DRAM is to be BiMOS, there is no increased process complexity because buried laeers are part of the typical BiMOS process.

Figure 7:
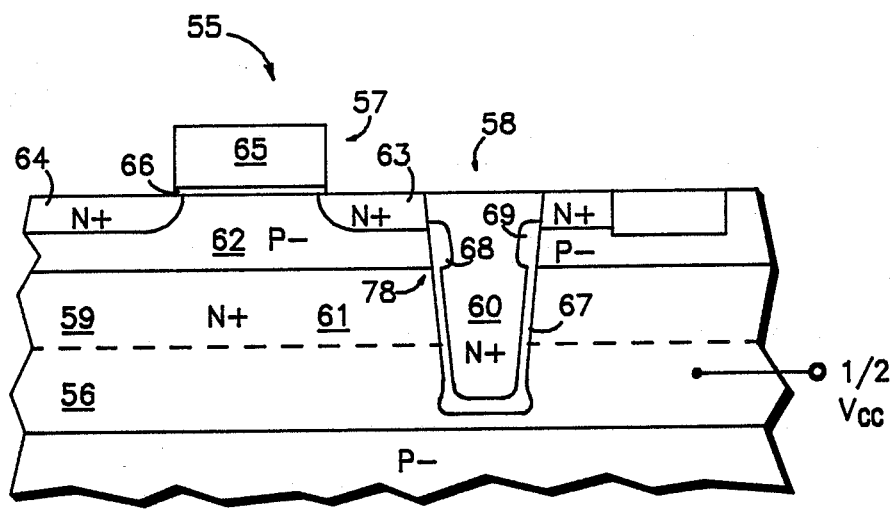
FIG. 7 is a cross-section of a DRAM cell according to a second embodiment of the inventinn.

Shown in FIG. 7 is a memory cell 55 formed with a P−substrate as starting material and comprised generally of a transistor 57 and a trench capacitor 5. An epitaxial layer 59 is grown on substrate 56. Substrate 56 is below the dotted line and epitaxial layer 59 is above the dotted line. An N+ buried layer is formed in both epitaxial layer 59 and substrate 56. Trench capacitor 58 is filled with N+ polysilicon 60 to form a first plate of capacitor 58. Transistor 57 is formed in a P− well 62. Well 62, although of the same conductivity type as the P− portion of substrate 34, is separately doped. Both the P channel transistors and the N channel transistors are formed nn wells. This is known as a twin well process which is typical for MOS integrated circuits which have an epitaxial layer. The wells which are of the same conductivity type as the starting material of the substrate are at the same voltage. In the present case the starting material of the substrate, substrate 56, is P-type conductivity so that the P wells will be biased to the same potential as substrate 56. Well 62 will then be biased to the same voltage as the P− portion of substrate 56, which may be, for example, ground potential. Transistor 57 includes a source region 63, a drain region 64, and a polysilicon gate 65. A gate insulator 66 insulates gate 65 from well 62. Trench capacitor 58 includes a dielectric 67 is the dielectric for capacitor 58. Buried layer 61 has a portion which adjoins dielectric 67. Well 62 also has a portion which adjoins dielectric 67. The portions of well 62 and buried layer 61 form a second plate of capacitor 58. Dielectric 67 includes a thicker portion 68 and a thicker portion 69. As shown in FIG. 7, trench capacitor 58 is formed from a trench etched into a semiconductor body in which one plate is the semiconductor body adjacent to the trench and the other plate is conductive material which fills the trench. These two plates are separated by an insulating layer which lines the trench.

Figure 8:
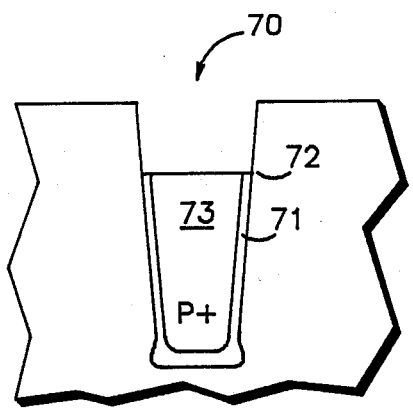
FIG. 8 is a cross-section of a trench used in the DRAM cell of FIG. 7 at a stage in processing.
Figure 9:
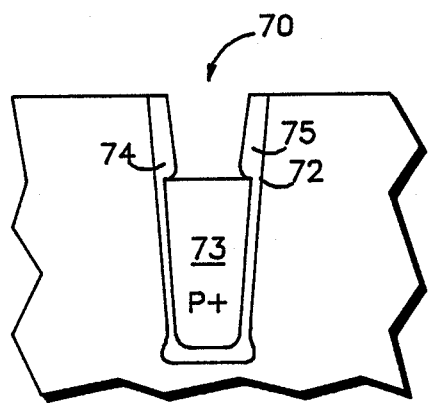
FIG. 9 is a cross-section of the trench of FIG. 8 at a subsequent stage in processing.
Figure 10:
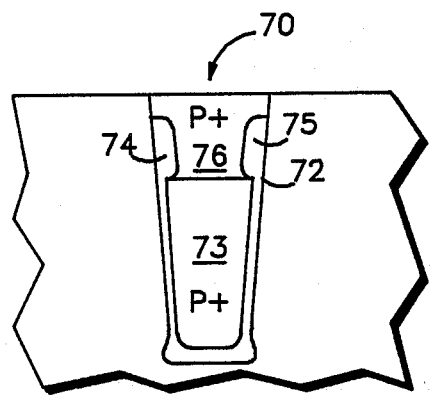
FIG. 10 is a cross-section of the trench of FIG. 9 at a subsequent stage in processing.

Dielectric 67 is formed as a thin layer which may be, for example, 170 Angstroms. Dielectric is then etched down from the surface. Subsequent thicker dielectric is then formed between the etched back portion and the surface. The thicker portion is then etched back to allow contact between polysilicon. These steps to form thicker portions 68 and 69 are depicted in more detail in FIGS. 8–10. Shown in FIG. 8 is a trench 70 with a dielectric 71 coating the surface thereof but etched down to a line 72 to which trench 70 is filled with P+ polysilicon 73. Shown in FIG. 9 is trench 70 with additional thicker dielectric portions 74 and 75. Shown in FIG. 10 is trench 70 with dielectric portions 74 and 75 etched back and P+ polysilicon 76 fills the remainder of trench 70 from line 72 to the surface. Portions 68 and 69 in FIG. 7 are analogous to portions 74 and 75 of FIG. 10. P+ polysilicon 60 of FIG. 7 is analogous to polysilicon 73 and polysilicon 76 combined.

One reason for thicker portions 68 and 69 is to increase the threshold voltage of a parasitic MOS transistor 78. The portion of well 62 between source 63 and buried layer 61 acts as a channel for parasitic transistor 78. Buried layer 61 and source 63 act as source and drain and polysilicon 60 acts as a gate of transistor 78. Portion 68 of dielectric 67 acts as the insulator between the gate and the channel of parasitic transistor 78. The thickness of portion 68 and the doping of well 62 combine to ensure that parasitic transistor 62 is not conductive. Another reason for thicker portions 68 and 69 is to ensure there is no dielectric breakdown or punchtrough between well 62 and polysilicon 60 inside the trench. There will be times when the full power supply voltage differential will be applied between well 62 and polysilicon 60. The reason for having the trench penetrate a buried layer which is biased to only ½ Vcc is to be able to reduce the dielectric thickness and thus increase capacitance.

Memory cell 55 has nn advantage over that of FIG. 1 because buried layer 61 can be electrically isolated from the P− portion of substrate 56 as well as other N wells. Buried layer 61 can thus be biased to a voltage which is, for examle, one half of the power supply voltage. This is shown as ½ Vcc in FIG. 7. This reduces the maximum voltage which will be developed across dielectric 67. With the reduction in maximum voltage, d;electric 67 can be made thinner which increases the capacitance of capacitor 58. Memory cell 55 of FIG. 7 then is an improvement over that of FIG. 1 at least by providing increased capacitance by being able to reduce the dielectric thickness of the trench capacitor. Memory cell 33 of FIG. 6 is thus an improvement over that of FIG. 1 at least because it eliminates the parasitie MOS transistor. These advantages are a direct result of having the primary part of one of the plates of the trench capacitor of a DRAM cell be a buried layer. This is achieved by having the trench of the trench capacitor penetrate a buried layer.

In both embodiments, FIG. 6 and FIG. 7, the trench of the trench capacitor penetrates a buried layer. The buried layer, as used herein, is a region in a semiconductor body which is below the surface of the semiconductor body and which is greater in concentration than the doping concentration of the starting material. As shown as being available from prior art processing, the buried layer may be either the same type of conductivity or opposite type conductivity of the starting material The method shown uses epitaxial growth to develop a buried layer This approach to forming a buried layer has been commonly done in forming bipolar transistors in integrated circuits. This approach has also been used in BiMOS processes. Another approach to forming a buried layer is to implant through the surface of the semiconductor body with sufficient energy so that the resulting doped region is sufficiently below the surface for the memory cell purpose. This approach may prove to be better. One reason it may prove to be better is that it may result in not needing to grow the epitaxial layer. In any event, the present invention is directed to a memory cell which has a trench capacitor which penetrates a buried layer not to how a buried layer is formed.

I claim:

1. In a semiconductor body including a substrate of a first conductivity and doped to a first concentration, an epitaxial layer grown on the substrate to form a surface of the semiconductor body, and a buried layer of a second conductivity and of a second concentration greater than said first concentration formed below said surface in a region overlapping the substrate and the epitaxial layer, a memory cell comprising:
   a transistor having a gate and a conduction path; and
   a trench capacitor coupled to one side of the conduction path, said trench capacitor formed of a trench which penetrates the surface and said buried layer, said trench capacitor characterized as having a first plate formed of conductive material inside the trench coupled to the conduction path, and a second plate, said second plate being substantially a portion of the buried layer adjacent to the trench.

2. In the semiconductor body of claim 1 wherein the memory receives a power supply voltage provided externally from the memory, the capacitor further characterized as having its second plate biased to a voltage which is between 30% and 70% of the power supply voltage.

3. In the semiconductor body of claim 2 wherein a well of the first conductivity type is formed in the epitaxial layer between the surface and the buried layer, the transistor further characterized as having a source, a drain, and a channel formed in the well and the well further characterized as having a portion adjacent to a portion of the trench above the buried layer.

4. In the semiconductor body of claim 3, the capacitor further characterized as having an insulating layer between the first plate and the portions of the well and the buried layer which are adjacent to the trench.

5. In the semiconductor body of claim 4, the insulating layer further characterized as having a first thickness along portions between the buried layer and the trench and a second thickness between the well and the trench, said second thickness being greater than said first thickness.

6. In the semiconductor body of claim 1 wherein a well of the first conductivity type is formed in the epitaxial layer between the suraace and the buried layer, the transistor further characterized as having a source, a drain, and a channel formed in the well and the well further characterized as having a portion adjacent to a portion of the trench above the buried layer.

7. In the semiconductor body of claim 6, the capacitor further characterized as having an insulating layer between the first plate and the portions of the well and the buried layer which are adjacent to the trench.

8. In a semiconductor body including a substrate, an epitaxial layer grown on the substrate to form a surface of the semiconductor body, and a well of a of a first conductivity type formed in said epitaxial layer, said epitaxial layer and said substrate having at least a region of a second conductivity type, a memory cell comprising;
 a transistor having a gate and a conduction path formed in said well; and
 a trench capacitor coupled to one side of the conduction path, said capacitor formed of a trench which penetrates the well and said region of the second conductivity type; said capacitor having a first plate formed of conductive material inside the trench coupled to the conduction path, and a second plate being substantially a portion of said region adjacent to the trench; and said capacitor having an insulating layer between the first plate and the well and between the first plate and said region, said insulating layer having a first thickness along portions between said region and the first plate and a second thickness between the well and the first plate, said second thickness being greater than said first thickness.

9. In a semiconductor body including a substrate of a first conductivity and doped to a first concentration and a buried layer of a second conductivity and of a second concentration greater than said first concentration formed below a surface of said substrate, a memory cell comprising;
 a transistor having a gate and a conduction path; and
 a trench capacitor coupled to one side of the conduction path, said trench capacitor formed of a trench which penetrates the surface and said buried layer, said trench capacitor characterized as having a first plate formed of conductive material inside the trench coupled to the conduction path, and a second plate, said second plate being substantially a portion of the buried layer adjacent to the trench.

10. In the semiconductor body of claim 9 wherein the memory receives a power supply voltage provided externally from the memory, the capacitor further characterized as having its second plate biased to a voltage which is between 30% and 70% of the power supply voltage.

11. In the semiconductor body of claim 10 wherein a well of the first conductivity type is formed in the surface of the substrate above the buried layer, the transistor further characterized as having a source, a drain, and a channel formed in the well and the well further characterized as having a portion adjacent to a portion of the trench above the buried layer.

12. In the semiconductor body of claim 11, the capacitor further characterized as having an insulating layer between the first plate and the portions of the well and the buried layer which are adjacent to the trench.

13. In the semiconductor body of claim 12, the insulating layer further characterized as having a first thickness along portions betwee the buried layer and the trench and a second thickness between the well and the trench, said second thickness being greater than said first thickness.

14. In the semiconductor body of claim 9 wherein a well of the first conductivity type is formed in the surface of the substrate above the buried layer, the transistor further characterized as having a source, a drain, and a channel formed in the well and the well further characterized as having a portion adjacent to a portion of the trench above the buried layer.

15. In the semiconductor body of claim 14, the capacitor further characterized as having an insulating layer between the first plate and the portions of the well and the buried layer which ar adjacent to the trench.

* * * * *